US005665524A

United States Patent [19]

Kashio et al.

[11] Patent Number: 5,665,524

[45] Date of Patent: Sep. 9, 1997

[54] METHOD FOR PRODUCING A PRINTING PLATE AND METHOD IF ITS USE

[75] Inventors: Shigetora Kashio, Okazaki; Toju Kosuga, Nishinomiya; Kuniyuki Takahashi, Urayasu, all of Japan

[73] Assignee: Toray Industries, Inc., Japan

[21] Appl. No.: 756,539

[22] Filed: Nov. 26, 1996

Related U.S. Application Data

[63] Continuation of Ser. No. 463,043, Jun. 5, 1995, abandoned.

[51] Int. Cl.[6] .............................. G03F 7/00; G03F 7/26; G03C 5/00; G03C 5/16

[52] U.S. Cl. .......................... 430/300; 430/307; 430/330; 430/348; 430/964; 430/944; 101/465; 101/467

[58] Field of Search .................................. 430/300, 307, 430/330, 348, 964; 101/465, 467

[56] References Cited

U.S. PATENT DOCUMENTS

| | | | |
|---|---|---|---|
| 3,663,289 | 5/1972 | Newman | 117/4 |
| 3,742,853 | 7/1973 | Landsman | 101/401.1 |
| 3,779,779 | 12/1973 | Landsman | 96/36.3 |
| 4,064,205 | 12/1977 | Landsman | 264/25 |
| 4,390,614 | 6/1983 | Peck et al. | 430/252 |
| 4,420,552 | 12/1983 | Peck et al. | 430/252 |
| 4,717,639 | 1/1988 | Dubin et al. | 430/124 |
| 4,912,014 | 3/1990 | Feldman | 430/202 |
| 5,322,761 | 6/1994 | Kausch et al. | 430/273 |
| 5,487,338 | 1/1996 | Lewis et al. | 101/467 |

FOREIGN PATENT DOCUMENTS

| | | | |
|---|---|---|---|
| 1 800 383 | 5/1969 | Germany | 430/348 |
| 56-148579 | 11/1981 | Japan . | |
| 7-112523 | 5/1995 | Japan . | |

OTHER PUBLICATIONS

H.R. Anderson, Jr., "Materials for Thermoplastic Recording by Heat Alone", IBM Technical Disclosure Bulletin, vol. 6, No. 12 May 1964.

*Primary Examiner*—Glenn A. Caldarola
*Assistant Examiner*—J. Pasterczyk
*Attorney, Agent, or Firm*—Austin R. Miller

[57] ABSTRACT

A method for producing a printing plate which involves forming an image on the surface of a sheet having open cells by selectively applying a thermal exposure to the surface of the sheet. The sheet is a thermoplastic resin preferably having melting point between about 50° to 150° C. The resulting printing plate has a planar surface with no relief sections; instead there are porous and nonporous sections, with the porous sections being permeable to ink infused within the printing plate. A method of printing using the above plate is also disclosed.

1 Claim, 2 Drawing Sheets

METHOD FOR PRODUCING A PRINTING PLATE AND METHOD IF ITS USE

This application is a continuation of application Ser. No. 08/463,043, filed Jun. 5, 1995 now abandoned.

BACKGROUND OF THE INVENTION

1. Field of the Invention

The present invention relates to a simple method for producing a printing plate, and particularly relates to a direct production method which eliminates the developing step in the production of a printing plate.

2. Description of the Prior Art

The printing plate art has experienced such rapid advancement that resinous relief printing plates, planographic printing plates and intaglio printing plates, all formed using photosensitive resins, now enjoy widespread use. Additionally, the use of simple printing systems (e.g., photocopiers) has expanded beyond the office into homes, with this trend expected only to gain in momentum. These trends have converged to create a demand for a printing plate producible via an uncomplicated, easy-to-use system.

Several stencil printing plate production methods offer greater simplicity, and thus are becoming more and more popular. For example, one known method for forming a stencil printing plate involves the use of a thermal printer or a wire dot printer to form a stencil image on a sheet which is then utilized as a printing plate.

Another known method for forming a stencil printing plate involves applying a heat ray to melt part of a film of a master sheet comprising a fusible film on an ink-permeable screen, with the master sheet being applied to an original black and white image film. However, this method requires that a particular coloring material with carbon being used as the original image film due to its ability to readily absorb heat. Further, the master sheet itself is expensive.

Yet another method involves forming an ink-soaked printing plate by heat-pressing a photosensitive resinous printing plate, having a relief formed thereon, and a sheet having open cells. However, this method still involves the complicated process of producing either a metal printing plate or a photosensitive resinous printing plate, and the use of a press machine or heated roller is required. Further, positioning the embossing plate properly on the sheet prior to pressing can be challenging to those unskilled in the art, and partial deviations from the proper position can readily occur. Thus, lay persons would have difficulty producing such printing plates.

OBJECTS OF THE INVENTION

An object of the present invention is to provide a simple method for producing a printing plate which lay persons may use successfully, with such method producing a printing plate which is able to print continuously.

Another object of the present invention is to provide a method for producing a printing plate that does not involve a wet-treatment developing process.

Other objects and advantages of the invention will become apparent to those skilled in the art from the detailed description of the invention, the drawings and the appended claims.

SUMMARY OF THE INVENTION

The present invention provides a method for producing a printing plate which comprises forming an image on a surface of an open-celled sheet by selectively applying an energy ray to the surface of the sheet. The sheet comprises a thermoplastic resin having open cells and preferably has a melting point between about 50° to 150° C.

In particular, the present invention provides a new method for producing an ink-soaked printing plate comprising a thermoplastic resin sheet having open cells and a low melting point. The open cells on the face of the sheet form the image area, while the non-image area is formed on the face of the sheet by melting selected portions of the sheet through the selective application of energy rays.

DETAILED DESCRIPTION OF THE INVENTION

The sheet of the invention comprises a thermoplastic resin preferably having a melting point between about 50° to 150° C. The term "melting point" is used in its ordinary meaning but encompasses the softening point of non-crystalline polymers.

The preferred melting points are determined as follows: If the sheet melting point is below about 50° C., sheet solidification and/or sheet distortion may take place if the sheet is stored where high temperatures may exist. Conversely, if the melting point is above about 150° C., an undesirably strong energy ray may need to be used to solidify the surface of the sheet, depending on ambient conditions.

As the thermoplastic resin, a polyolefin is preferable, but polyurethane, polyacetal, polyethylene, polystyrene and polyamide are also preferable.

The thermoplastic resin sheet should also be open-celled. "Open-celled" refers to a continuous cell structure where cells communicate directly or indirectly with other cells, whereby a liquid can pass from cell to cell. "Solidification" of sheet surfaces refers to the substantial elimination of cells where the sheet is melted, thus rendering solidified portions of the sheet substantially impermeable to liquid.

Figure 1:
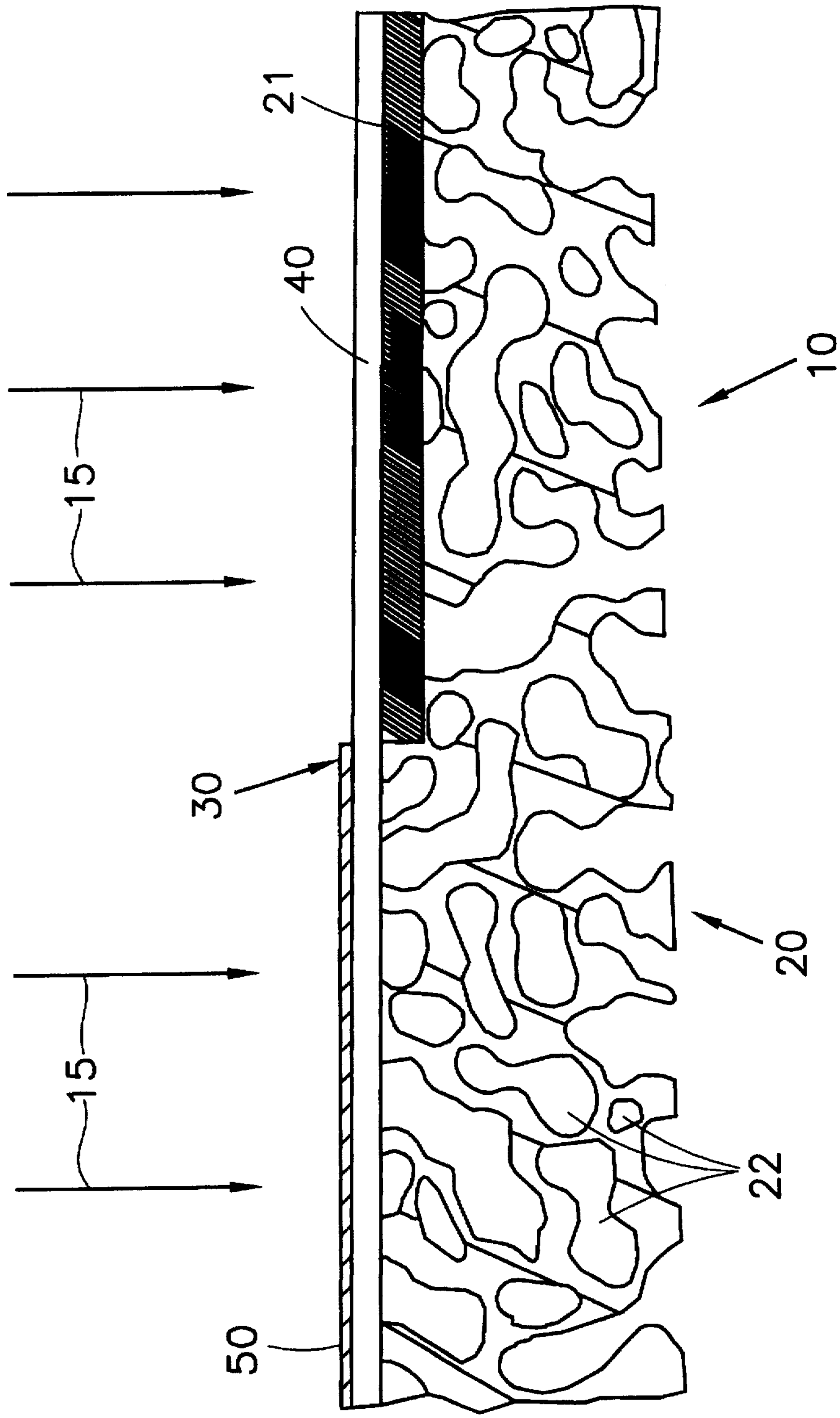
FIG. 1 shows a schematic cross-sectional view of a printing plate of the invention and a mask being irradiated with an energy ray.

Referring now to FIG. 1, the number 10 designates an example of a printing plate produced by the method of the invention. Open-celled thermoplastic resin sheet 20 is partially protected from energy rays 15 by mask 30. In the embodiment shown in FIG. 1, mask 30 includes a transparent film 40 and an overlying image 50. The surface of sheet 20 protected by image 50 retains an open-cell structure 22, while the surface of sheet 20 exposed to energy rays through film 40 is melted and substantially solidified, thereby forming solidified surface portion 21. Of course, it is possible to employ printing plates of the invention without using a mask 30, as demonstrated in the examples.

Figure 2:
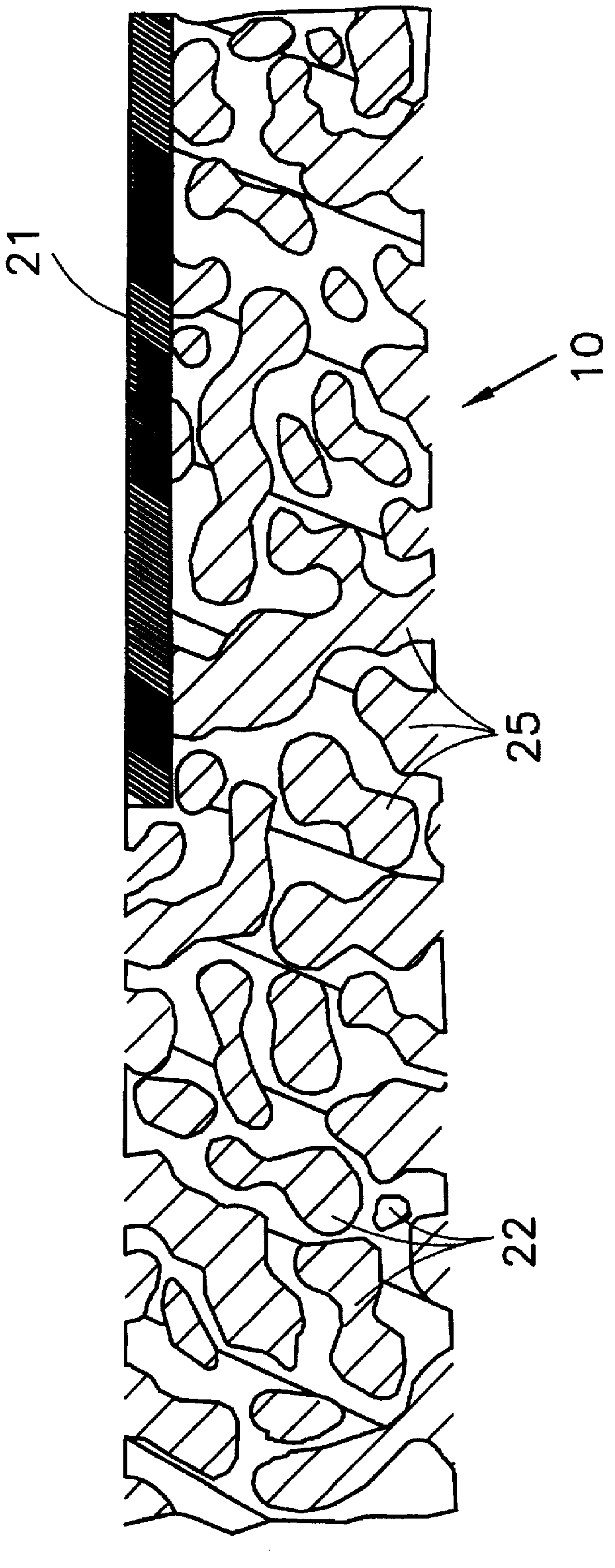
FIG. 2 shows a schematic cross-sectional view of a printing plate of the invention charged with ink.

Printing ink would subsequently be infused into the open cells of the thusly-formed printing plate. FIG. 2 shows a printing plate 10 produced by the method of the invention after being charged with ink. Ink-filmed cells 25 are found throughout printing plate 10 except at solidified surface portion 21.

The open-celled sheet used in the present invention, an example of which is disclosed in JP 47-39212B, may be obtained by forming a mixture of a polyolefin in accordance with an extrusion method known in the art and then treating the sheet with an inorganic acid containing dissolved calcium. In another method disclosed in JP 57-42651B, an open-celled sheet is obtained by kneading a powdery substance and a thermoplastic polyolefin resin, the powdery substance capable of being dissolved in water or in an aqueous acid solution. The resulting mixture is then formed into a desired shape, followed by washing of the formed product with water. Additionally, an open-celled sheet may be obtained by subjecting a foam sheet having closed cells to needle-punching or the like to destroy the cell-to-cell walls, thereby creating continuous cells.

The terms "energy beam" or "energy ray," as sometimes used hereinafter refer to any ray, beam, radiation or light which is capable of supplying thermal energy to the open-celled sheet, and is preferably selected from ultra-violet rays, infra-red rays, visible rays and electron rays. Preferable sources of the energy ray include flash lamps, strobe lamps, laser generators and the like. Of course, a wide variety of rays, beams, radiation and types of light, together with their associated sources, may be employed.

The printing plate of the present invention may be obtained by attaching to the open-celled sheet a mask film capable of selectively intercepting the energy ray, and then applying the energy ray over the mask film. The material of the mask film is a substance permeable to the energy ray, and may be selected from, for example, plastic films, sheets of polyethylene, polypropylene, polyester, polyvinylchloride, polyvinylidenechloride or polyamide, silver salt films, tracing paper and the like.

The printing plate of the present invention may also be obtained without using mask film by connecting an energy ray generator, such as a laser beam generator or an electron beam generator, to a computer. A pattern of image and non-image areas on the open-celled sheet is then formed by selectively applying the energy ray based on image information from the computer.

EXAMPLE 1

A positive image film 200μm thick, made of a transparent polyester similar to transparent film 40 shown in FIG. 1 having a pattern of letters and design similar to image 50 shown in FIG. 1, was applied to an open-celled polyethylene sheet (made by Yamahachi Chemical, 3 mm thick). An electron-ray shooter (made by Riso Kagaku "ZENOFAX") then applied an infra-red ray over the positive image film. Surfaces of the sheet exposed to the ray were melted and solidified by the heat, while unexposed surfaces of the sheet were not melted, thereby preserving the open-cell structure on those surface. A simple printing plate was thusly formed. The positive image film was removed from the polyethylene sheet.

Ink was injected into the open cells remaining on the resulting polyethylene sheet for two hours to soak through all of the open cells uniformly. A stamp was formed by adhering the sheet to a board. When the stamp was pressed to paper, a clear pattern of letters and design was transcribed on the paper. No stain on the non-printing portion was observed.

EXAMPLE 2

An open-celled plastic sheet (Kikuchi Manufacturing Co. Ltd. "POLA VOLELON") was applied to a transparent film, the film having letters thereon written with an oily ink pen (made by Pentel). A ray from a flash lamp was then shot over the transparent film.

The ray melted the exposed surfaces of the sheet, thus solidifying the exposed surfaces, while the open-cell structure of the unexposed surfaces of the sheet (protected from the ray by the oily ink) was preserved.

Ink was injected into the remaining open cells by the same method as Example 1, whereby an excellent printing plate was obtained.

EXAMPLE 3

A negative film having letters and designs written thereon as generated by a word processor using a "RAKURAKU System" (Mutec, Inc.) was applied to an open-celled sheet, and rays from a Xenon flash lamp (made by Ushio Electric) were shot over the negative film. The ray solidified the exposed surfaces of the sheet, while the open-cell structure was preserved on the unexposed surfaces of the sheet. Ink was injected into the remaining open cells by an injector, and the sheet was stored for approximately 24 hours. Printing was carried out using the obtained printing plate by the same method as Example 1, and an excellent positive print was obtained.

EXAMPLE 4

A manuscript generated by a word processor was printed inversely on KPD film (made by Kimoto Inc.), and the resulting negative film was applied to an open-celled sheet. A ray from a Xenon flash lamp (made by Ushio Electric) was shot over the negative film. The ray solidified the exposed surfaces of the sheet, while the open-cell structure was preserved on the unexposed surfaces of the sheet. Printing was carried out after treating the obtained printing plate with ink by the same method as described in Example 3, and an excellent positive print was obtained.

EXAMPLE 5

A pattern of letters and designs generated by a computer was laser-scanned directly onto an open-celled sheet of polyolefinic foam (made by Yamahati Chemical). The exposed surfaces of the sheet were solidified by the laser scanning.

After ink was injected into the open cells remaining on the sheet as described in Example 1, the sheet was stabilized, was pressed to paper, and an excellent positive print was subsequently obtained.

Although this invention has been described and shown in connection with specific forms thereof, it will be appreciated that a wide variety of equivalents may be substituted for the specific elements described herein without departing from the spirit and scope of this invention as defined in the appended claims.

What is claimed is:

1. In a method of forming an image on a planar surface of a thermoplastic resin sheet having a printing surface and a reverse surface, which sheet comprises an open-cell structure throughout the thickness of said sheet, which open-cell structure serves as a sponge comprising an ink reservoir having passageways for fluid ink to flow from cell to cell in said reservoir and to said printing surface thereby providing a continuous supply of ink to the imaged printing surface of said plate, the steps for creating said image on said sheet surface at substantially the same surface plane as said planar surface of said sheet without raising any relief surface above any part of said image surface, and without closing or collapsing any substantial volume of said open cells comprising said reservoir, which steps comprise:

selectively applying thermal exposure to seal, at a temperature of about 50°–150° C., limited superficial cells of said sheet at said planar surface only, without substantial penetration beneath said surface and without causing said cells to collapse beneath said planar surface, thereby forming superficial sealing of cells rendering a non-image pattern which is essentially impermeable to flow of fluid ink to provide solidified surface portions located only at said planar surface of said sheet, while leaving other surface portions unsealed to provide printing surfaces in accordance with said image, soaking the resulting imaged sheet for hours sufficient to infuse fluid printing ink throughout the entire sheet by causing said ink to enter and substantially completely film with fluid printing ink essentially all of said open cells of said sheet, and repeatedly applying the resulting printing surface to substrates to print said image thereon with ink stored within said plate and flowing through said open cells and through said unsealed areas of said planar surface.

* * * * *